United States Patent [19]

Shakuda

[11] Patent Number: 5,557,115
[45] Date of Patent: Sep. 17, 1996

[54] LIGHT EMITTING SEMICONDUCTOR DEVICE WITH SUB-MOUNT

[75] Inventor: Yukio Shakuda, Kyoto, Japan

[73] Assignee: Rohm Co. Ltd., Japan

[21] Appl. No.: 513,624

[22] Filed: Aug. 10, 1995

[30] Foreign Application Priority Data

Aug. 11, 1994 [JP] Japan .................. 6-189565
Aug. 18, 1994 [JP] Japan .................. 6-194224

[51] Int. Cl.$^6$ ........................................ H01L 33/00
[52] U.S. Cl. .................. 257/81; 257/94; 257/97; 257/99; 257/680
[58] Field of Search .................. 257/99, 98, 94, 257/96, 97, 81, 91, 680

[56] References Cited

U.S. PATENT DOCUMENTS

| | | | |
|---|---|---|---|
| 3,304,429 | 2/1967 | Bonin et al. | 257/99 X |
| 3,593,070 | 7/1971 | Reed | 257/99 X |
| 5,479,029 | 12/1995 | Uchida et al. | 257/99 X |

Primary Examiner—William Mintel
Attorney, Agent, or Firm—Michael D. Bednarek; Kilpatrick & Cody

[57] ABSTRACT

A light emitting semiconductor device is provided which comprises a semiconductor chip and a sub-mount assembled with the semiconductor chip. The semiconductor chip includes a light-permeable insulating substrate and a laminate of semiconductor layers formed on a support surface of the insulating substrate for generating light to be emitted from a tail surface of the substrate. The sub-mount includes an electrically conductive substrate having a mounting surface facing the support surface of the insulating substrate. The mounting surface of the conductive substrate is formed with at least one auxiliary anode electrode which is electrically connected to the conductive substrate and an anode electrode of the semiconductor chip. The mounting surface of the conductive substrate is also formed with at least one auxiliary cathode electrode which is insulated from the conductive substrate but electrically connected to a cathode electrode of the semiconductor chip.

6 Claims, 7 Drawing Sheets

Comparison

LIGHT EMITTING SEMICONDUCTOR DEVICE WITH SUB-MOUNT

BACKGROUND OF THE INVENTION

1. Field of the Invention

This invention relates to a light emitting semiconductor device, and more particularly to a light emitting semiconductor device of the type which incorporates a sub-mount for mounting to a mount such as a leadframe. The present invention also relates to a method of making such a semiconductor device.

2. Description of the Related Art

In recent years, various light emitting semiconductor devices have been developed. In particular, a blue light emitting diode (blue LED) with a high brightness has been made available, wherein gallium nitride (GaN) compound crystal layers are successively grown on a sapphire substrate by organic metal chemical vapor deposition (hereafter abbreviated as "MOCVD").

Figure 11:
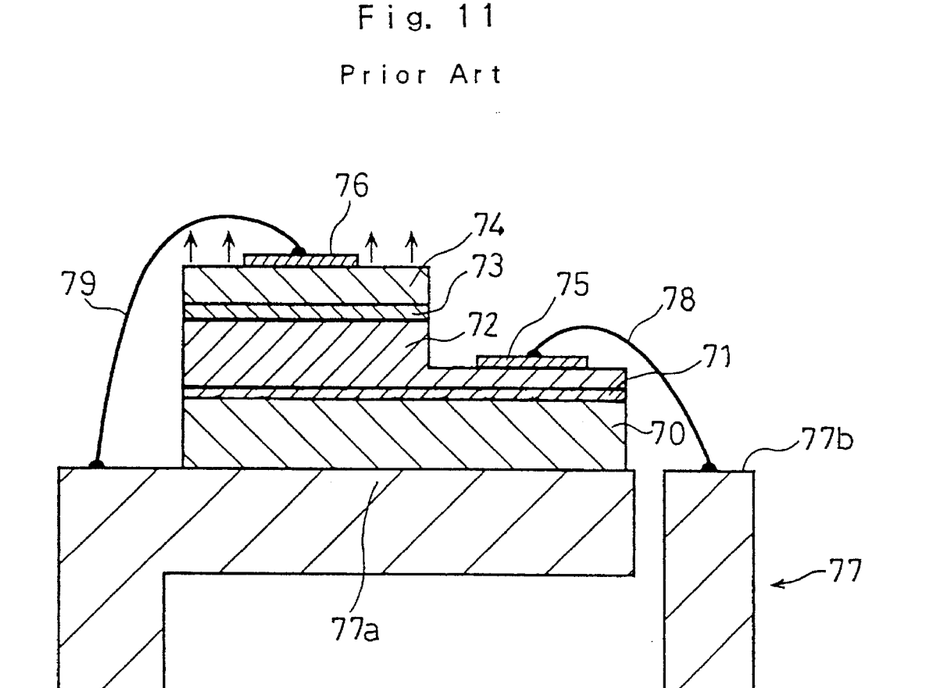
FIG. 11 is a view, in vertical section, showing a prior art light emitting semiconductor device.
Figure 12:
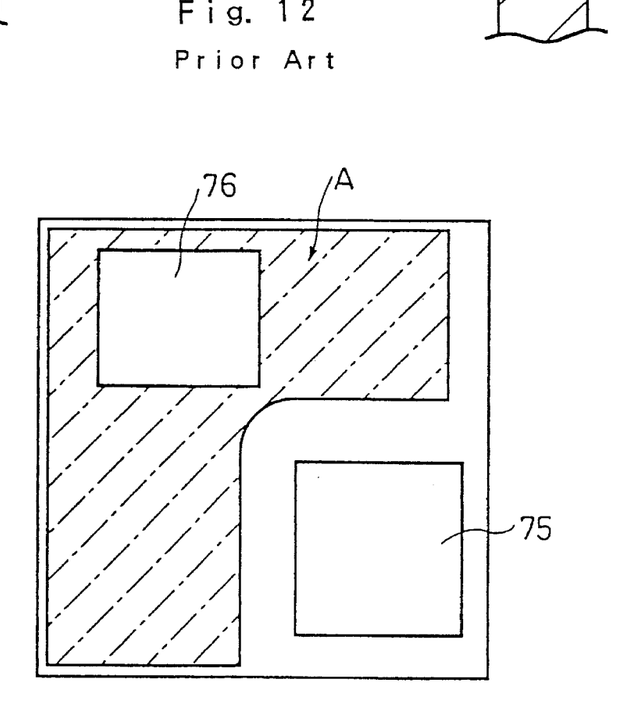
FIG. 12 is a plan view showing the prior art device.

Specifically, as shown in FIG. 11 of the accompanying drawings, a GaN type blue LED comprises a sapphire substrate 70 on which a GaN buffer layer 71 is formed, and a crystal layer laminate is formed on the buffer layer 71. The laminate includes two N-type semiconductor layers 72 (GaN and AlGaN layers represented as a single layer in FIG. 11), a light emitting semiconductor layer 73 (InGaN layer), and two P-type semiconductor layers 75 (AlGaN and GaN layers also represented as a single layer in FIG. 11). A cathode electrode 75 is formed on the N-type GaN layer, whereas an anode electrode 76 is formed on the P-type GaN layer, as also shown in FIG. 12.

The LED described above is mounted on a mount. A typical example of the mount is a leadframe 77 having a first lead 77a (anode lead) and a second lead 77b (cathode lead).

In assembly, the sapphire substrate 70 is bonded on the first lead 77a of the leadframe 77 by an adhesive for example. Further, the cathode electrode 75 is electrically connected to the second lead 77b of the leadframe 77 through a bondwire 78, whereas the anode electrode 76 is electrically connected to the first lead 77a through another bondwire 79.

In operation, a drive voltage is applied across the first and second leads 77a, 77b. As a result, the LED is activated for light emission from the side of the P-type layers 72 in a direction perpendicular thereto.

According to the arrangement described above, wirebonding need be performed at least at two positions. This causes an increase of time and labor required for mounting the LED relative to the leadframe 77, thereby leading to a cost increase.

Further, since the LED is made to emit light from the side of the P-type layers 72, the anode electrode 76 provided on the side of the P-type layers occupies a part of the light emitting area A indicated in FIG. 12. This means that the part of the light emitting area A occupied by the anode electrode 76 is not utilizable for light emission. Thus, even if the LED is designed to have a capability of generating light with a high brightness, it is impossible to provide a sufficient amount of light, thereby failing to meet the demand for high luminosity indication in addition to posing limitations on the location and configuration of the anode electrode 76. Such a problem becomes even more serious if the area assumed by the anode electrode 76 becomes larger.

SUMMARY OF THE INVENTION

It is, therefore, an object of the present invention to provide a light emitting semiconductor device which can provide an increased area of light emission while facilitating mounting and wirebonding of the device relative to a mount such as a leadframe.

A further object of the present invention is to provide a method of advantageously making such a semiconductor device.

According to a first aspect of the present invention, there is provided a light emitting semiconductor device comprising:

a semiconductor chip; and a sub-mount assembled with the semiconductor chip;

wherein the semiconductor chip includes: a light-permeable insulating substrate having a support surface and a tail surface opposite to the support surface; a laminate of semiconductor layers formed on the support surface of the insulating substrate, the laminate including at least one N-type layer, a light emitting layer for generating light for emission from the tail surface of the substrate, and at least one P-type layer; at least one anode electrode formed on the P-type layer; and at least one cathode electrode formed on the N-type layer; and wherein the sub-mount includes an electrically conductive substrate having a mounting surface facing the support surface of the insulating substrate, the mounting surface of the conductive substrate being formed with at least one auxiliary anode electrode which is electrically connected to the conductive substrate and the anode electrode of the semiconductor chip, the mounting surface of the conductive substrate being also formed with at least one auxiliary cathode electrode which is insulated from the conductive substrate but electrically connected to the cathode electrode of the semiconductor chip.

Preferably, the tail surface of the insulating substrate may be provided with a light-permeable optical filter for selectively allowing passage of light rays having a predetermined range of wavelength. In this case, it is advantageous if the optical filter comprises at least two filter layers which differ from each other in refractive index.

Each of the auxiliary anode and cathode electrodes is made of a thermally meltable metal for soldering. In this case, the respective auxiliary electrodes of the sub-mount can be conveniently bonded to the respective electrodes of the semiconductor chip without requiring a separate solder.

The auxiliary cathode electrode may have an excess portion located outside an outer contour of the semiconductor chip. The excess portion can be conveniently utilized for wirebonding to a relevant lead of a leadframe.

The laminate may be covered by an insulating layer having bores respectively extending to the anode and cathode electrodes of the semiconductor chip, and the insulating layer may be formed with an anode-side metal layer and a cathode-side metal layer. In this case, the anode-side and cathode-side metal layers have leg portions extending through the bores of the insulating layer into electrical conduction with the anode and cathode electrodes, respectively, of the semiconductor chip, whereas the anode-side and cathode-side metal layers are held in electrical contact with the auxiliary anode and cathode electrodes, respectively, of the sub-mount.

According to another aspect of the present invention, there is provided a method of making a light emitting semiconductor device which comprises: a semiconductor chip; and a sub-mount assembled with the semiconductor chip; wherein the semiconductor chip includes: a light-permeable insulating substrate having a support surface and a tail surface opposite to the support surface; a laminate of semiconductor layers formed on the support surface of the insulating substrate, the laminate including at least one N-type layer, a light emitting layer for generating light for emission from the tail surface of the substrate, and at least one P-type layer; at least one anode electrode formed on the P-type layer; and at least one cathode electrode formed on the N-type layer; and wherein the sub-mount including an electrically conductive substrate having a mounting surface, the mounting surface of the conductive substrate being formed with at least one auxiliary anode electrode electrically connected to the conductive substrate, the mounting surface of the conductive substrate being also formed with at least one auxiliary cathode electrode which is insulated from the conductive substrate; the method comprising the steps of:

separately preparing the semiconductor chip and the sub-mount; and assembling the semiconductor chip and the sub-mount so that the support surface of the insulating substrate faces the mounting surface of the conductive substrate to bring the auxiliary anode and cathode electrodes of the sub-mount into electrical conduction with the anode and cathode electrodes of the semiconductor chip.

Other objects, features and advantages of the present invention will be fully understood from the following detailed description given with reference to the accompanying drawings.

DETAILED DESCRIPTION OF THE PREFERRED EMBODIMENTS

Figure 1:
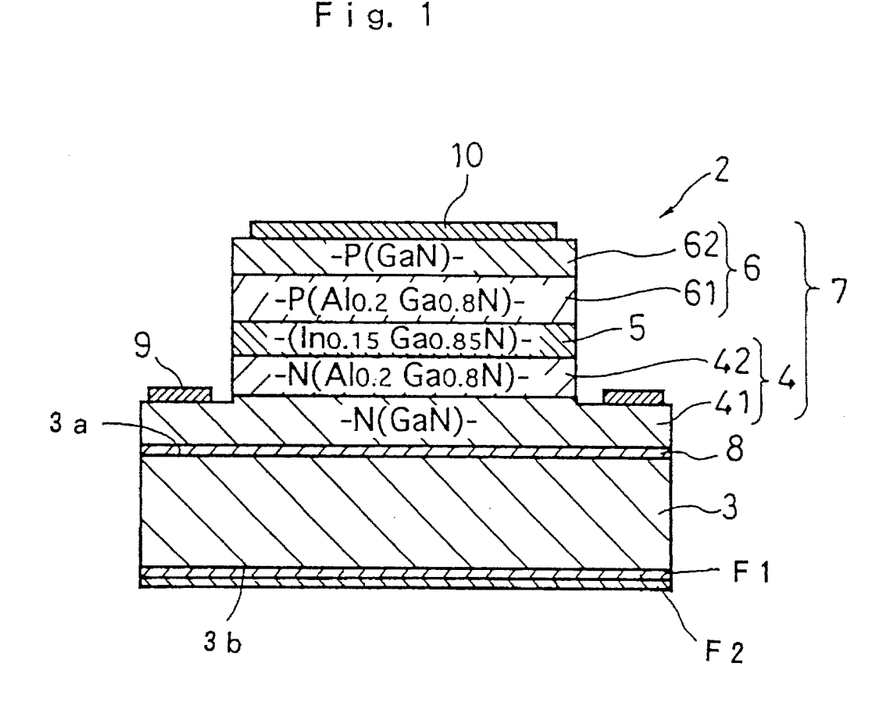
FIG. 1 is a view, in vertical section, showing a semiconductor chip incorporated in a light emitting device according to the first embodiment of the present invention.
Figure 2:
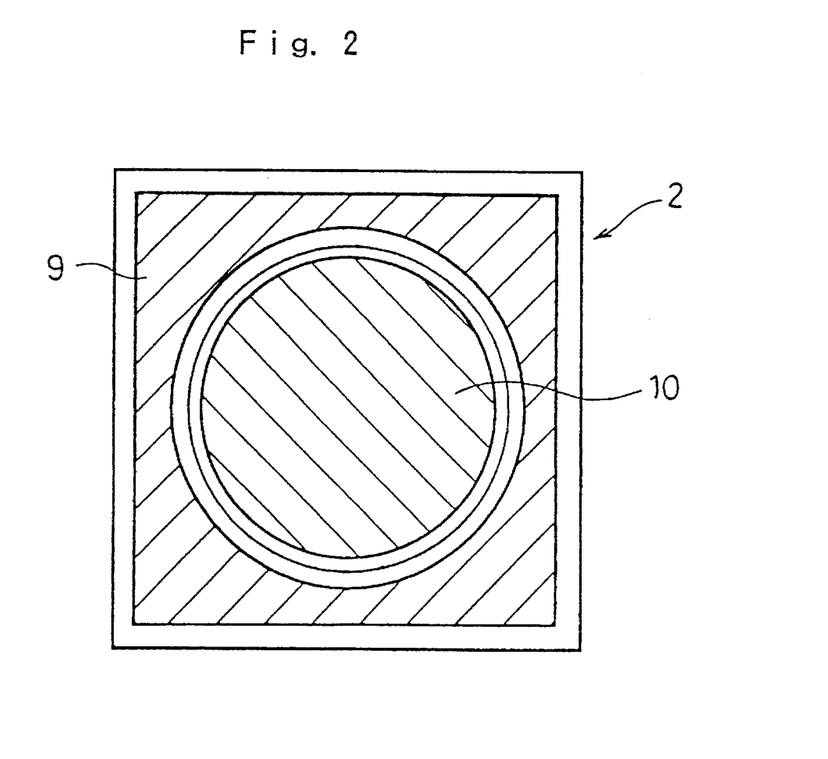
FIG. 2 is a plan view showing the same chip.
Figure 3:
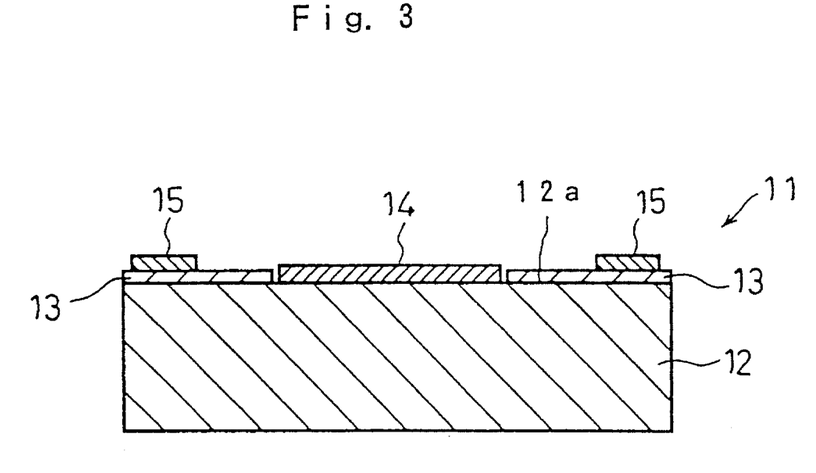
FIG. 3 is a view, in vertical section, showing a sub-mount to be assembled with the semiconductor chip to constitute the light emitting device of the first embodiment.
Figure 4:
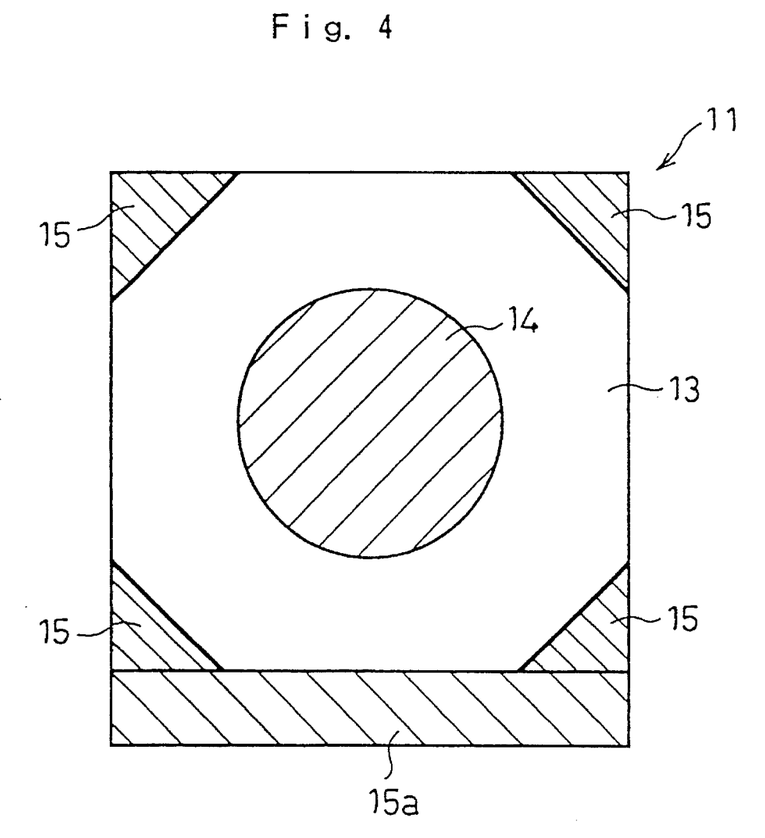
FIG. 4 is a plan view showing the same sub-mount.

Referring first to FIGS. 1 through 5 of the accompanying drawings, there is shown a light emitting semiconductor device 1 (see FIG. 5) according to a first embodiment of the present invention. The semiconductor device 1 mainly comprises a light emitting semiconductor chip 2 (FIGS. 1 and 2) and a sub-mount 11 (FIGS. 3 and 4).

As best shown in FIG. 1, the semiconductor chip 2 comprises a sapphire substrate 3 having a support surface 3a for supporting a laminate 7 which includes two N-type layers 4, a light emitting layer 5, and two P-type layers 6. The substrate 1 may be transparent or semi-transparent. The semiconductor chip 2 may have a square form have a side length of 0.5 mm for example.

The laminate 7 is formed on a buffer layer 8 of gallium nitride (GaN) which in turn is formed on the support support 3a of the substrate 3. The laminate 7 comprises an N-type GaN layer 41, an N-type $Al_{0.2}Ga_{0.8}N$ layer 42, an $In_{0.15}Ga_{0.85}N$ layer as the light emitting layer 5, a P-type $Al_{0.2}Ga_{0.8}N$ layer 61, and a P-type GaN layer 62, all of which are successively formed in the mentioned order from the buffer layer 8.

According to the present embodiment, the thicknesses of the layers 41, 42, 5, 61 and 62 may be set, respectively, at 3 μm, 300 nm, 50 nm, 300 nm and 150 nm for example. Further, the $In_{15}Ga_{0.85}N$ light emitting layer 5 is made to generate blue light which preferably has a wave length of about 470 nm.

The N-type GaN layer 41 and the N-type $Al_{0.2}Ga_{0.8}N$ layer 42 contain silicon (Si) as an additive, whereas the P-type $Al_{0.2}Ga_{0.8}N$ layer 61 and the P-type GaN layer 62 contain magnesium (Mg) as an additive. Further, the $In_{0.15}Ga_{0.85}N$ light emitting layer 5 contains zinc (Zn) as an additive. If the mixture ratio (mixed crystal ratio) of In to Ga in the light emitting layer 5 increases, the wave length of the light generated at this layer 5 also increases. Similarly, if the amount of Zn added to the $In_{0.15}Ga_{0.85}N$ layer 5 increases the wave length of the light generated at this layer 5 also increases.

According to the present embodiment, further, the substrate 3 has a tail surface 3b formed with an optical filter which includes a first transparent filter layer F1 and a second transparent filter layer F2. Typically, the first filter layer F1 may be made of $Al_2O_3$, whereas the second filter layer F2 may be made of $SiO_2$. Alternatively, the first filter layer F1 may be made of $Al_2O_3$, whereas the second filter layer F2 may be made of SiN. While the two filter layers F1, F2 may be made of other materials, they should differ from each other in refractive index. The thickness of the two filter layers F1, F2 should be an integer multiple of the predetermined wavelength or half wavelength of the light generated by the light emitting layer 5, so that light rays lying in an intended wavelength range predominantly pass through the filter layers F1, F2 while those rays lying outside the intended wavelength range are predominantly reflected at the interfaces of each filter layer F1, F2.

As shown in FIGS. 1 and 2, the laminate 7 is partially etched away to expose a peripheral portion of the N-type GaN layer 41. A cathode electrode 9 is formed on the exposed peripheral portion of the N-type GaN layer 41. By contrast, an anode electrode 10 is formed on the P-type GaN layer 62. The formation of the respective electrodes 9, 10 may be performed by any known method (e.g. deposition followed by etching).

In manufacture of the semiconductor chip 2, the GaN buffer layer 8 is first formed on the square sapphire substrate 1 by MOCVD, and each different layer 41, 42, 5, 61, 62 of the laminate 7 is successively grown as single crystal layer by MOCVD. Such production may be performed by a chip-by-chip basis for experimental purposes. For practical purposes, however, a plurality of such semiconductor devices should be manufactured together by performing successive crystal growth on a common sapphire substrate or wafer and thereafter dicing the laminate-wafer structure into the individual semiconductor devices.

As shown in FIGS. 3 and 2, the sub-mount 11 comprises an electrically conductive, non-transparent substrate 12 (mainly made of silicon for example) having a mounting surface 12a formed with an insulating layer 13 of $SiO_2$ for example. The insulating layer 13 is centrally etched away to expose a central portion of the conductive substrate 12, and the substrate central portion is formed with an auxiliary anode electrode 14.

The insulating layer 13 is provided with a plurality of triangular auxiliary cathode electrodes 15 and a strip-like excess portion 15a. As appreciated by comparing FIG. 4 with FIG. 2, the triangular auxiliary cathode electrodes 15 generally correspond in position to the four corners of the square semiconductor chip 2. The strip-like excess portion 15a connects between two of the triangular auxiliary cathode electrodes 15 and extends outside the contour of the semiconductor chip 2 (see also FIG. 5), as more specifically described later.

The auxiliary electrodes 14, 15, 15a may be equally made of an Au—Sn alloy or an indium (In). These electrodes may be made of other alloy, provided that the alloy is thermally meltable for soldering purposes, as described later. The formation of the auxiliary electrodes may be performed by deposition.

Figure 5:
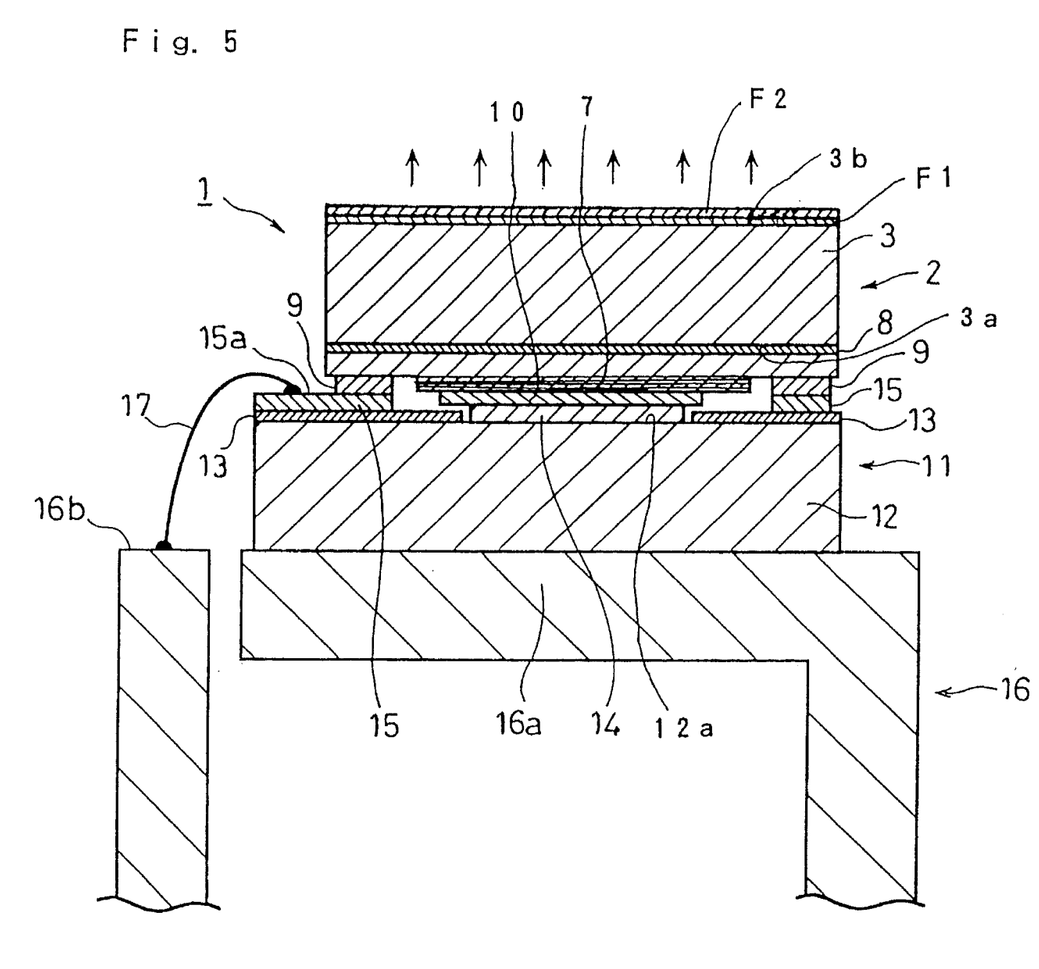
FIG. 5 is a view, in vertical section, showing the entire light emitting device of the first embodiment.

FIG. 5 shows how the semiconductor chip 2 and the sub-mount 11 are assembled together. Specifically, the semiconductor chip 2 is arranged on the sub-mount 11 with the support surface 3a of the substrate 3 facing the mounting surface 12a of the conductive substrate 12. In this condition, the cathode electrode 9 (FIG. 2) of the chip 2 is soldered to the triangular auxiliary cathode electrodes 15 (FIG. 4) of the sub-mount 11, whereas the anode electrode 10 of the chip 2 is soldered to the auxiliary anode electrode 14 of the sub-mount 11. As previously described, the auxiliary electrodes 14, 15 of the sub-mount 11 are equally made of a thermally meltable metal, so that such soldering can be performed simply by heating.

In the assembled state shown in FIG. 5, the anode electrode 10 of the semiconductor chip 2 is held in electrical conduction with the conductive substrate 12 through the auxiliary anode electrode 14. On the other hand, the cathode electrode 9 together with the auxiliary cathode electrodes 15, 15a remains insulated from the conductive substrate 12 by the insulating layer 13. Further, the strip-like excess portion 15a is located outside the contour of the chip 2.

FIG. 5 also shows how the assembly of the semiconductor chip 12 and sub-mount 11 is mounted to a leadframe 16 which has a first lead 16a (anode-side lead) and a second lead 16b (cathode-side lead). Specifically, the sub-mount 11 is bonded to the first lead 16a of the leadframe 16 with the mounting surface 12a of the conductive substrate 12 directed away from the first lead. The strip-like excess portion 15a is electrically connected to the second lead 16b through a bondwire 17.

In the thus assembled and mounted state, the anode electrode 10 of the semiconductor chip 2 is held in electrical conduction with the first lead 16a through the conductive substrate 12, the auxiliary anode electrode 14, whereas the cathode electrode 9 of the chip 2 is held in electrical conduction with the second lead 16b through the bondwire 17 and the auxiliary anode electrodes 15, 15a. For protection of the light emitting semiconductor device 1, the assembly of the chip 2 and sub-mount 11 may be molded in a resin package (not shown).

It should be understood that the laminate 7 of the semiconductor chip 2 is greatly exaggerated in FIG. 1 for distinctly illustrating the respective layers 41, 42, 5, 61, 62, as clearly appreciated by comparison with FIG. 5. Further, it should be also appreciated that the other elements (e.g. buffer layer 8, filter layers F1, F2, insulating layer 13, and electrodes 9, 10, 14, 15, 15a) are also exaggerated for purposes of clearer illustration with respect to their thicknesses.

In operation, a predetermined voltage is applied across the first and second leads 16a, 16b. As a result, the semiconductor chip 2 is activated for blue light emission from the tail surface 3b of the sapphire substrate 3 in a direction perpendicular thereto, as indicated by the arrows in FIG. 5.

According to the arrangement of the present embodiment described above, the light emission is made from the tail surface 3b of the light-permeable sapphire substrate 3 on which no electrode is formed. Thus, a major area of the substrate tail surface 3b can be utilized for light emission without hinderance by the centrally located anode electrode 10 of the semiconductor chip 2. For example, about 75% of the substrate tail surface 3b is utilizable for light emission, thereby leading to an increase of light amount and brightness.

On the other hand, light is also emitted toward the sub-mount 11. However, the thus directed light is reflected back on the non-transparent sub-mount 11 for returning to the semiconductor chip 2 and for emitting from the tail surface 3b of the light-permeable substrate 3. Therefore, the light emitting semiconductor device 1 provides light utilizing efficiency.

Further, due to the use of the sub-mount 11, wirebonding need be performed only with respect to the strip-like excess portion 15a, as shown in FIG. 5. Thus, the mounting operation for the light emitting semiconductor device 1 is facilitated in comparison with the prior art wherein both anode and cathode electrodes need be wirebonded.

According to the present embodiment, moreover, the tail surface 3b of the light-permeable substrate 3 is provided with the filter layers F1, F2 which predominantly allow passage of those rays lying in a predetermined wavelength range of about 470 nm (if blue light is intended) while filtering off those rays lying outside the predetermined wavelength range. Thus, the light actually emitted from the substrate tail surface 3b will have a higher degree of chroma and clarity than if no such filter is provided.

Figure 6:
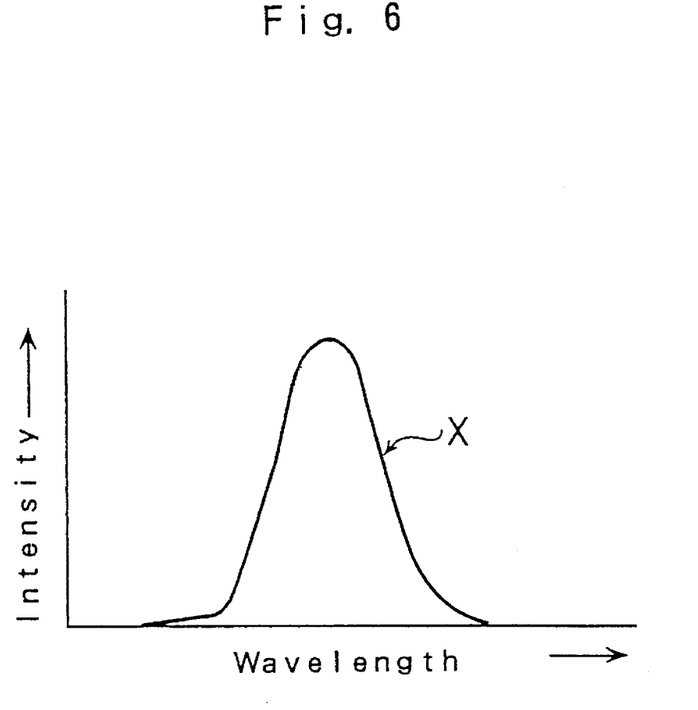
FIG. 6 is a graph showing the characteristics of the light emitting device of the first embodiment.
Figure 7:
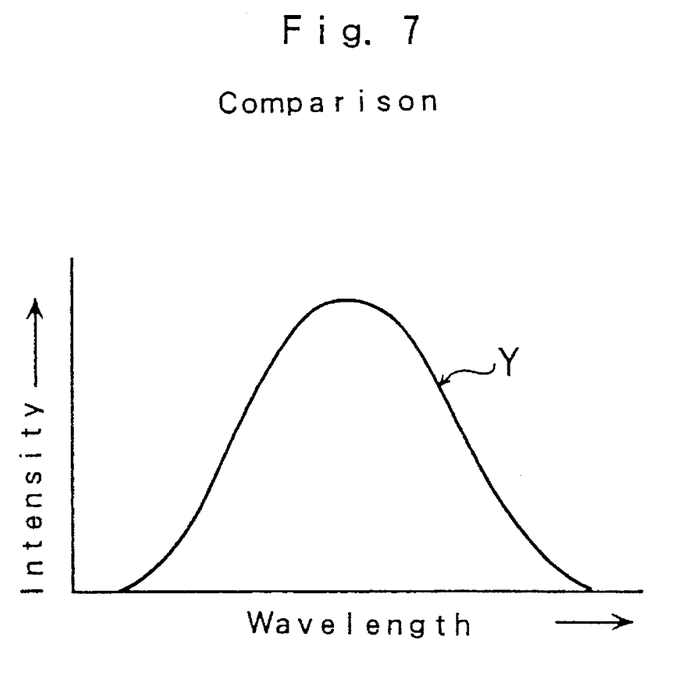
FIG. 7 is a graph showing the characteristics obtainable when an optical filter is removed from the light emitting device of the first embodiment.

FIGS. 6 and 7 provide a graphic comparison in wavelength distribution between filtered light and non-filtered light. In these graphs, the ordinate represents light intensity, whereas the abscissa represents wavelength. The filtered light (indicated by the curve X in FIG. 6) exhibits a smaller half-width (meaning that the wavelength range is narrower) than the non-filtered light (indicated by the curve Y in FIG. 7).

While the two filter layers F1, F2 are provided on the substrate tail surface 3b according to the present embodiment, the number of filter layers provided on the substrate tail surface 3b is optional. Further, the light emitting semiconductor device 1 may be made to emit light of any color (e.g. green, red, and etc.), in which case the filter layer or layers need be correspondingly adjusted in thickness and refraction index.

Figure 8:
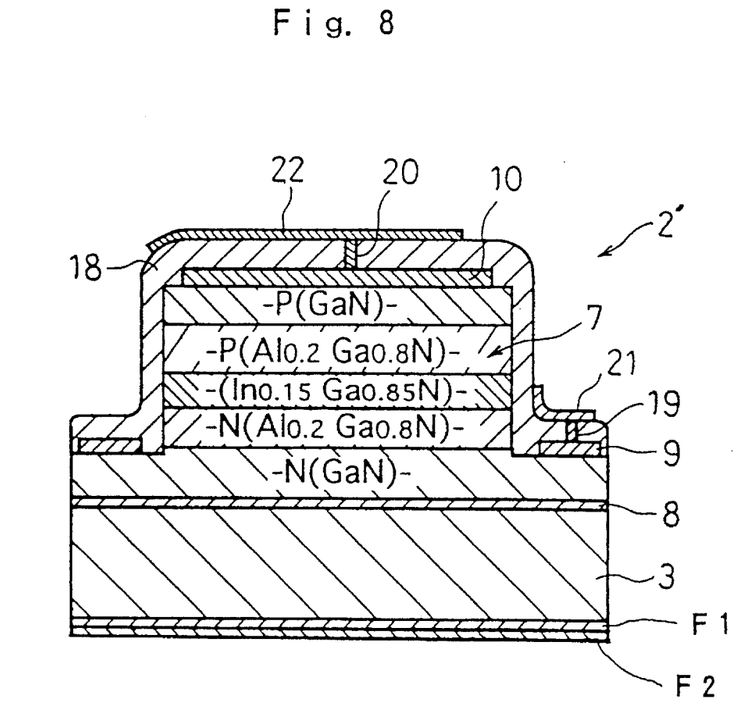
FIG. 8 is a view, in vertical section, showing a semiconductor chip incorporated in a light emitting device according to the second embodiment of the present invention.
Figure 9:
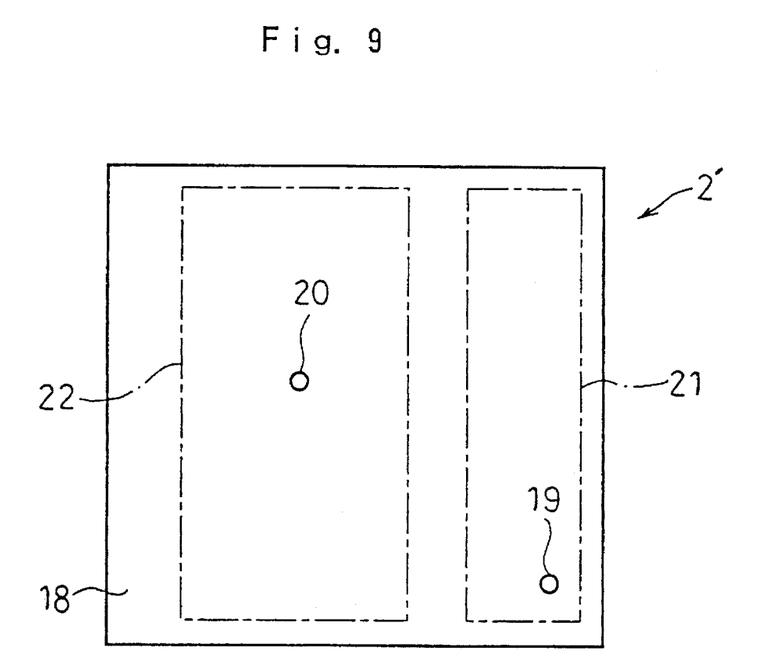
FIG. 9 is a plan view showing the same chip of FIG. 8.
Figure 10:
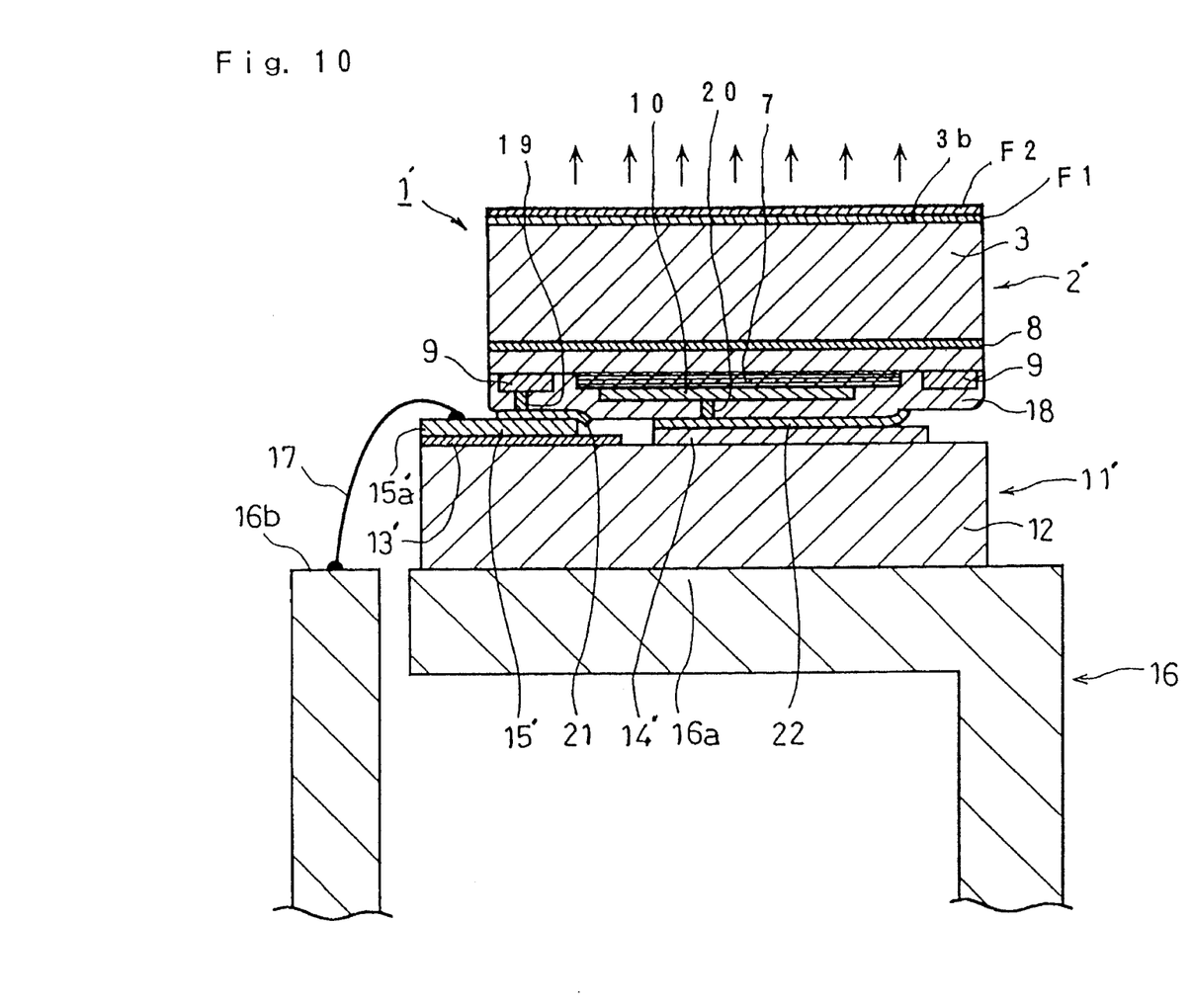
FIG. 10 is a view, in vertical section, showing the entire light emitting device of the first embodiment.

FIGS. 8 through 10 show a light emitting semiconductor device 1' according to a second embodiment of the present invention. Similarly to the first embodiment, the semiconductor device 1' of this embodiment comprises a semiconductor chip 2' which includes a sapphire substrate 3, a laminate 7 of different crystal layers, a buffer layer 8, a cathode electrode 9, an anode electrode 10, and two filter layers F1, F2. Therefore, these elements are not described here for avoiding duplicated description.

According to the second embodiment, the laminate 7 together with the respective electrodes 9, 10 is covered by an insulating layer 18 of e.g. $SiO_2$ or $Si_3N_4$ formed by CVD (chemical vapor deposition). The insulating layer 18 has bores 19, 20 extending through the thickness of the insulating layer 18 to the respective electrodes 9, 10. Further, the insulating layer 18 is provided with a rectangular cathode-side metal layer 21 (see FIG. 9) and a rectangular anode-side metal layer 22. The respective metal layers 21, 22 may be made of an Au—Sn alloy or an indium alloy.

The cathode-side metal layer 21 has a leg portion extending through the corresponding bore 19 for connection to the cathode electrode 9. Similarly, the anode-side metal layer 22 has a leg portion extending through the corresponding bore 20 for connection to the anode electrode 10.

The semiconductor device 1' of the second embodiment also comprises a sub-mount 11' which includes an electrically conductive, non-transparent substrate 12, similarly to the first embodiment. The substrate 12 directly carries an auxiliary anode electrode 14" in corresponding relation to the anode-side metal layer 22. The substrate 12 is also formed with an insulating layer 13' which carries an auxiliary cathode electrode 15" in corresponding relation to the cathode-side metal layer 21. The auxiliary cathode electrode 15" has an excess portion 15a' extending outside the contour of the semiconductor chip 2'.

In assembly, the semiconductor chip 2' is mounted in an inverted state onto the sub-mount 11' so that the cathode-side and anode-side metal layers 21, 22 come into contact with the auxiliary cathode and anode electrodes 15', 14', respectively Then, after soldering by heating, the excess portion 15a' of the auxiliary cathode electrode 15' is electrically connected to the second lead 16b of the leadframe 16 by a bondwire 17.

The light emitting semiconductor device 1' of the second embodiment is otherwise identical to that of the first embodiment. It is therefore apparent that the second embodiment enjoys substantially the same advantages as the first embodiment.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

I claim:

1. A light emitting semiconductor device comprising:

a semiconductor chip; and a sub-mount assembled with the semiconductor chip;

wherein the semiconductor chip includes: a light-permeable insulating substrate having a support surface and a tail surface opposite to the support surface; a laminate of semiconductor layers formed on the support surface of the insulating substrate, the laminate including at least one N-type layer, a light emitting layer for generating light for emission from the tail surface of the substrate, and at least one P-type layer; at least one anode electrode formed on the P-type layer; and at least one cathode electrode formed on the N-type layer; and wherein the sub-mount includes an electrically conductive substrate having a mounting surface facing the support surface of the insulating substrate, the mounting surface of the conductive substrate being formed with at least one auxiliary anode electrode which is electrically connected to the conductive substrate and the anode electrode of the semiconductor chip, the mounting surface of the conductive substrate being also formed with at least one auxiliary cathode electrode which is insulated from the conductive substrate but electrically connected to the cathode electrode of the semiconductor chip.

2. The device according to claim 1, wherein the tail surface of the insulating substrate is provided with a light-permeable optical filter for selectively allowing passage of light rays having a predetermined range of wavelength.

3. The device according to claim 2, wherein the optical filter comprises at least two filter layers which differ from each other in refractive index.

4. The device according to claim 1, wherein each of the auxiliary anode and cathode electrodes is made of a thermally meltable metal for soldering.

5. The device according to claim 1, wherein the auxiliary cathode electrode has an excess portion located outside an outer contour of the semiconductor chip.

6. The device according to claim 1, wherein the laminate is covered by an insulating layer having bores respectively extending to the anode and cathode electrodes of the semiconductor chip, the insulating layer being formed with an anode-side metal layer and a cathode-side metal layer, the anode-side and cathode-side metal layers having leg portions extending through the bores of the insulating layer into electrical conduction with the anode and cathode electrodes, respectively, of the semiconductor chip, the anode-side and cathode-side metal layers being held in electrical contact with the auxiliary anode and cathode electrodes, respectively, of the sub-mount.

\* \* \* \* \*